(12) United States Patent
Weaver, Jr. et al.

(10) Patent No.: US 8,780,559 B2
(45) Date of Patent: *Jul. 15, 2014

(54) HEAT EXCHANGE ASSEMBLY FOR USE WITH ELECTRICAL DEVICES AND METHODS OF ASSEMBLING AN ELECTRICAL DEVICE

(75) Inventors: Stanton Earl Weaver, Jr., Broadalbin, NY (US); Tao Deng, Clifton Park, NY (US); Hendrik Pieter Jacobus de Bock, Clifton Park, NY (US); Shakti Singh Chauhan, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 154 days.

This patent is subject to a terminal disclaimer.

(21) Appl. No.: 13/340,309

(22) Filed: Dec. 29, 2011

(65) Prior Publication Data

US 2013/0170142 A1 Jul. 4, 2013

(51) Int. Cl.
*H05K 7/20* (2006.01)

(52) U.S. Cl.
USPC . 361/700; 361/679.52; 361/704; 165/104.21; 165/104.26; 165/185

(58) Field of Classification Search
USPC .......... 361/679.52, 679.65, 700, 704, 679.54; 165/104.21, 104.26, 104.33, 185
See application file for complete search history.

(56) References Cited

U.S. PATENT DOCUMENTS

| | | | | |
|---|---|---|---|---|
| 4,688,537 A | * | 8/1987 | Calkins et al. | 123/557 |
| 5,069,274 A | * | 12/1991 | Haslett et al. | 165/272 |
| 5,343,940 A | * | 9/1994 | Jean | 165/104.33 |
| 5,735,489 A | * | 4/1998 | Drolen et al. | 244/171.8 |
| 5,969,940 A | * | 10/1999 | Sano et al. | 361/679.52 |
| 6,257,328 B1 | * | 7/2001 | Fujiwara et al. | 165/185 |
| 6,725,910 B2 | * | 4/2004 | Ishida et al. | 165/104.26 |
| 6,863,118 B1 | * | 3/2005 | Wang et al. | 165/104.26 |

(Continued)

FOREIGN PATENT DOCUMENTS

| | | | | | |
|---|---|---|---|---|---|
| JP | 2002098487 A | * | 4/2002 | | F28D 15/02 |
| JP | 2007095762 A | * | 4/2007 | | H01L 23/427 |
| JP | 2007139301 A | * | 6/2007 | | F28D 15/02 |
| JP | 2007150013 A | * | 6/2007 | | H01L 23/427 |

OTHER PUBLICATIONS

Ahmed Imtiaz Uddin et al., Micro Heat Pipes—A Promising Means of Thermal Solution for Desktop Computers, ICECE, Dhaka, Bangladesh, Dec. 20-22, 2008.

(Continued)

*Primary Examiner* — Robert J Hoffberg
(74) *Attorney, Agent, or Firm* — Scott J. Asmus

(57) ABSTRACT

An electrical device is described herein. The electrical device includes a housing that includes an inner surface that defines a cavity, a heat sink that is coupled to the housing and oriented along a first plane, and at least one electrical component positioned within the housing cavity and oriented along a second plane that is different than the first plane. A heat exchange assembly is coupled to the electrical component and the heat sink for adjusting a temperature of the electrical component. The heat exchange assembly includes an evaporator section, a condenser section, and a transport section extending between the evaporator section and the condenser section for channeling a working fluid between the evaporator section and the condenser section. The heat exchange assembly is configured to bend along at least one bending axis oriented with respect to the transport section.

16 Claims, 11 Drawing Sheets

(56) References Cited

U.S. PATENT DOCUMENTS

| | | | |
|---|---|---|---|
| 6,914,780 B1 * | 7/2005 | Shanker et al. | 361/679.47 |
| 6,997,245 B2 * | 2/2006 | Lindemuth et al. | 165/104.26 |
| 7,278,469 B2 * | 10/2007 | Sasaki et al. | 165/104.26 |
| 7,663,883 B2 * | 2/2010 | Shirakami et al. | 361/700 |
| 7,857,037 B2 * | 12/2010 | Parish et al. | 165/104.33 |
| 8,069,907 B2 * | 12/2011 | Bryant et al. | 165/46 |
| 2004/0037045 A1 | 2/2004 | Phillips et al. | |
| 2004/0045730 A1 | 3/2004 | Garner | |
| 2005/0276018 A1 | 12/2005 | Moore et al. | |
| 2006/0011336 A1 | 1/2006 | Frul | |
| 2006/0243428 A1 | 11/2006 | Sakayori et al. | |
| 2007/0068657 A1 | 3/2007 | Yamamoto et al. | |
| 2007/0127210 A1 | 6/2007 | Mahalingam et al. | |
| 2008/0029244 A1 | 2/2008 | Gilliland et al. | |
| 2008/0066891 A1 | 3/2008 | Jeng | |
| 2008/0173429 A1 | 7/2008 | Sasaki et al. | |
| 2008/0218980 A1 | 9/2008 | Tracewell et al. | |
| 2008/0291630 A1 | 11/2008 | Monh et al. | |
| 2009/0009969 A1 | 1/2009 | Chu | |
| 2009/0071632 A1 * | 3/2009 | Bryant et al. | 165/104.26 |
| 2010/0155033 A1 | 6/2010 | Holley et al. | |
| 2010/0200199 A1 | 8/2010 | Habib et al. | |
| 2010/0319882 A1 | 12/2010 | Lee et al. | |
| 2011/0088874 A1 | 4/2011 | Meyer, IV et al. | |
| 2011/0100608 A1 | 5/2011 | Huang et al. | |
| 2011/0198059 A1 | 8/2011 | Gavillet | |
| 2011/0203777 A1 | 8/2011 | Zhao et al. | |
| 2012/0111540 A1 * | 5/2012 | Dai et al. | 165/104.26 |
| 2012/0227936 A1 * | 9/2012 | Yang | 165/104.26 |
| 2013/0168050 A1 * | 7/2013 | Chauhan et al. | 165/104.21 |

OTHER PUBLICATIONS

Hiroyuki Ryoson et al., Thermal Performance of Novel Thin Heat Pipe, ISSN:1087-9870, on pp. 1-7, Jun. 2010.

Search Report and Written Opinion from corresponding PCT Application No. PCT/US2012/066110 dated Feb. 25, 2013.

* cited by examiner

HEAT EXCHANGE ASSEMBLY FOR USE WITH ELECTRICAL DEVICES AND METHODS OF ASSEMBLING AN ELECTRICAL DEVICE

BACKGROUND OF THE INVENTION

The subject matter described herein relates generally to electrical devices and, more particularly, to heat exchange assemblies for use with an electrical device and methods of assembling an electrical device.

At least some known electrical devices include a housing and an electrical component that is positioned within the housing. The housing includes a pair of outer walls, a pair of wedge locks coupled between the outer walls, and a heat sink coupled to the outer walls. In addition, known electrical devices include a heat exchange assembly that includes a heat spreader bar coupled to the electrical component and the wedge lock to facilitate transferring heat from the component to the heat sink. Known heat spreader bars include a solid plate (Cu or Al) that forms a tortuous heat path from the component, through the heat spreader bar, through the wedge lock, and to the heat sink. Because of the distance heat must travel along the heat path from the electrical component to the heat sink, known electrical devices have a limited heat transfer capacity.

During assembly of the electrical system within the housing, non-planarity and height mismatches between the hosing and the electrical components may occur. Due to the limited flexibility of the solid materials (heatspreader bars) and the planar architecture of the electrical housing, the thermal interface materials (TIM) between the various components along the thermal path are required to be thick, compliant, and include sufficient compressibility to accommodate the dimensional tolerances required to assembly the electrical device. This results in a substantially large thermal resistance contribution from the thermal interface materials which reduces the efficiency of heat transfer from the electrical component to the heat sink.

During operation, the electrical component generates heat. As the amount of heat generated by the component is increased the component operating temperature increases. As the temperature of the electrical component is increased, an operation of the electrical device may be adversely affected, and an operational reliability of the electrical component is reduced. Moreover, over time, the increased operating temperature may cause damage and/or failure of the electrical component, which results in an increase in the cost of operating and maintaining the electrical device.

BRIEF DESCRIPTION OF THE INVENTION

In one aspect, an electrical device is provided. The electrical device includes a housing that includes an inner surface that defines a cavity, a heat sink that is coupled to the housing and oriented along a first plane, and at least one electrical component positioned within the housing cavity and oriented along a second plane that is different than the first plane. A heat exchange assembly is coupled to the electrical component and the heat sink for adjusting a temperature of the electrical component. The heat exchange assembly includes an evaporator section, a condenser section, and a transport section extending between the evaporator section and the condenser section for channeling a working fluid between the evaporator section and the condenser section. The heat exchange assembly is configured to bend along at least one bending axis oriented with respect to the transport section.

In another aspect, an electrical device is provided. The electrical device includes at least one electrical component, a heat sink assembly, and a heat exchange assembly coupled to the electrical component and the heat sink assembly for adjusting a temperature of the electrical component. The heat exchange assembly includes a casing that includes an evaporator section coupled to the component, a condenser section coupled to the heat sink, and a transport section extending between the evaporator section and the condenser section along a longitudinal axis. The casing is configured to bend along a bending axis that is substantially perpendicular to the longitudinal axis.

In yet another aspect, a method of assembling an electrical device is provided. The method includes providing a housing including an inner surface that defines a cavity therein, coupling an electrical component to the housing inner surface, and coupling a heat exchange assembly to the electrical component and the housing for adjusting a temperature of the electrical component. The heat exchange assembly includes at least one sidewall that includes an evaporator section, a condenser section, and a transport section extending between the evaporator section and the condenser section for channeling a working fluid between the evaporator section and the condenser section. The sidewall is configured to bend along at least one bending axis oriented with respect to the transport section.

DETAILED DESCRIPTION OF THE INVENTION

The exemplary systems and methods described herein overcome at least some disadvantages of known electrical devices by providing a heat exchange assembly that includes a flexible casing coupled between an electrical component and a heat sink to facilitate transferring heat from the electrical component to the heat sink. Moreover, the heat exchange assembly is configured to bend about a bending axis such that the distance heat must travel from the component to the heat sink is reduced over known electrical devices. In addition, the heat exchange assembly described herein includes a condenser section, an evaporator section, and one or more fluid channels that channel a working fluid between the condenser section and the evaporator section. The heat exchange assembly is configured to facilitate transferring heat from the electrical component to the working fluid, and transferring heat from the working fluid to the heat sink. By providing a flexible heat exchange assembly that channels working fluid between the electrical component and the heat sink, the efficiency of heat transfer between the electrical component and heat sink is increased over known electrical devices. As such the operating efficiency of the electrical component is increased, and the cost of maintaining the electrical device is reduced. Furthermore, due to the flexibility (or, bendability) of the heat exchange assembly, the thermal interfaces can be made thin and rigid to maximize heat transfer because dimensional tolerances can be accommodated by the deflection of the heat exchange assembly.

Figure 1:
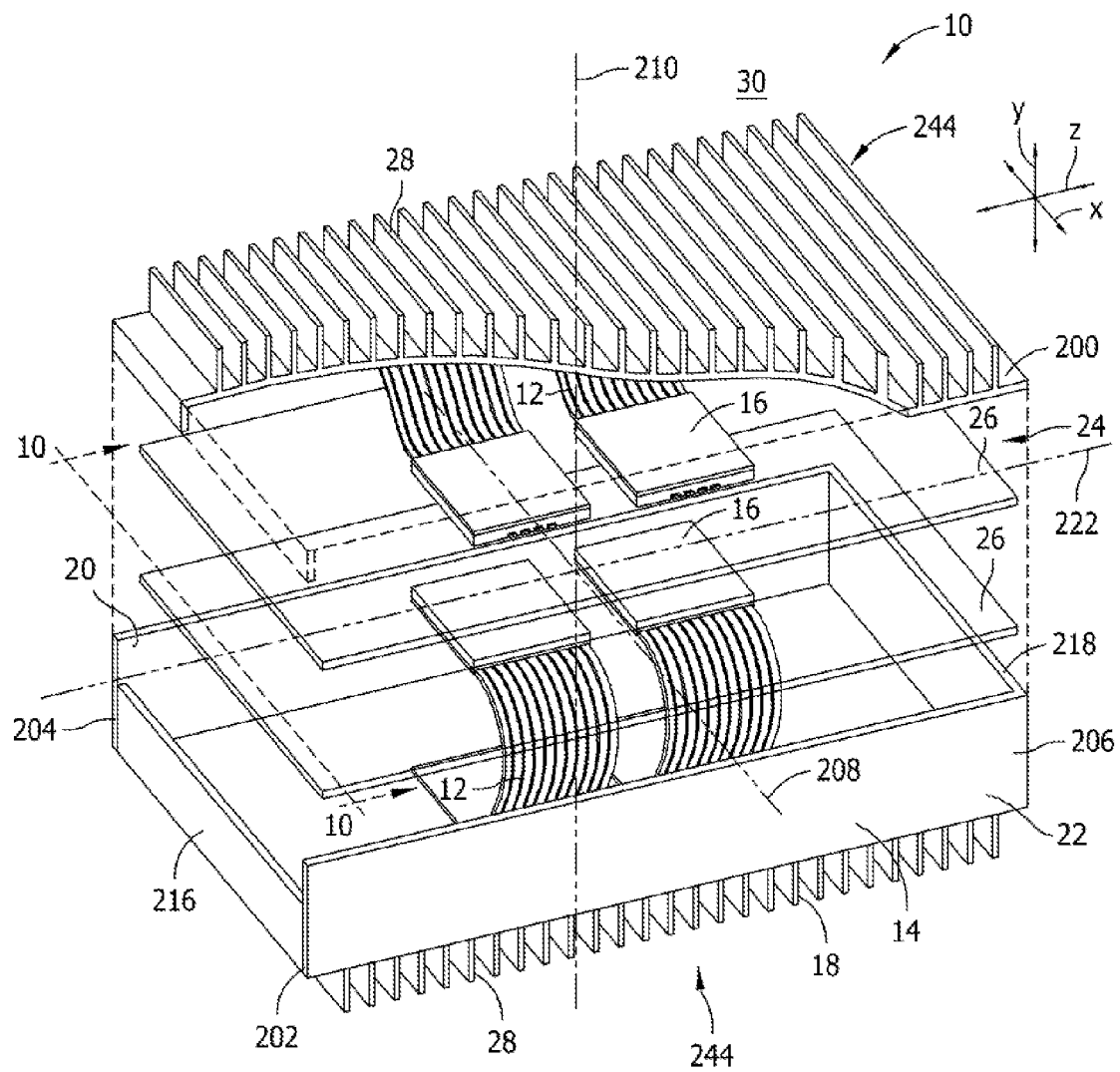
FIG. 1 is an exploded partial perspective view of an exemplary electrical device.
Figure 2:
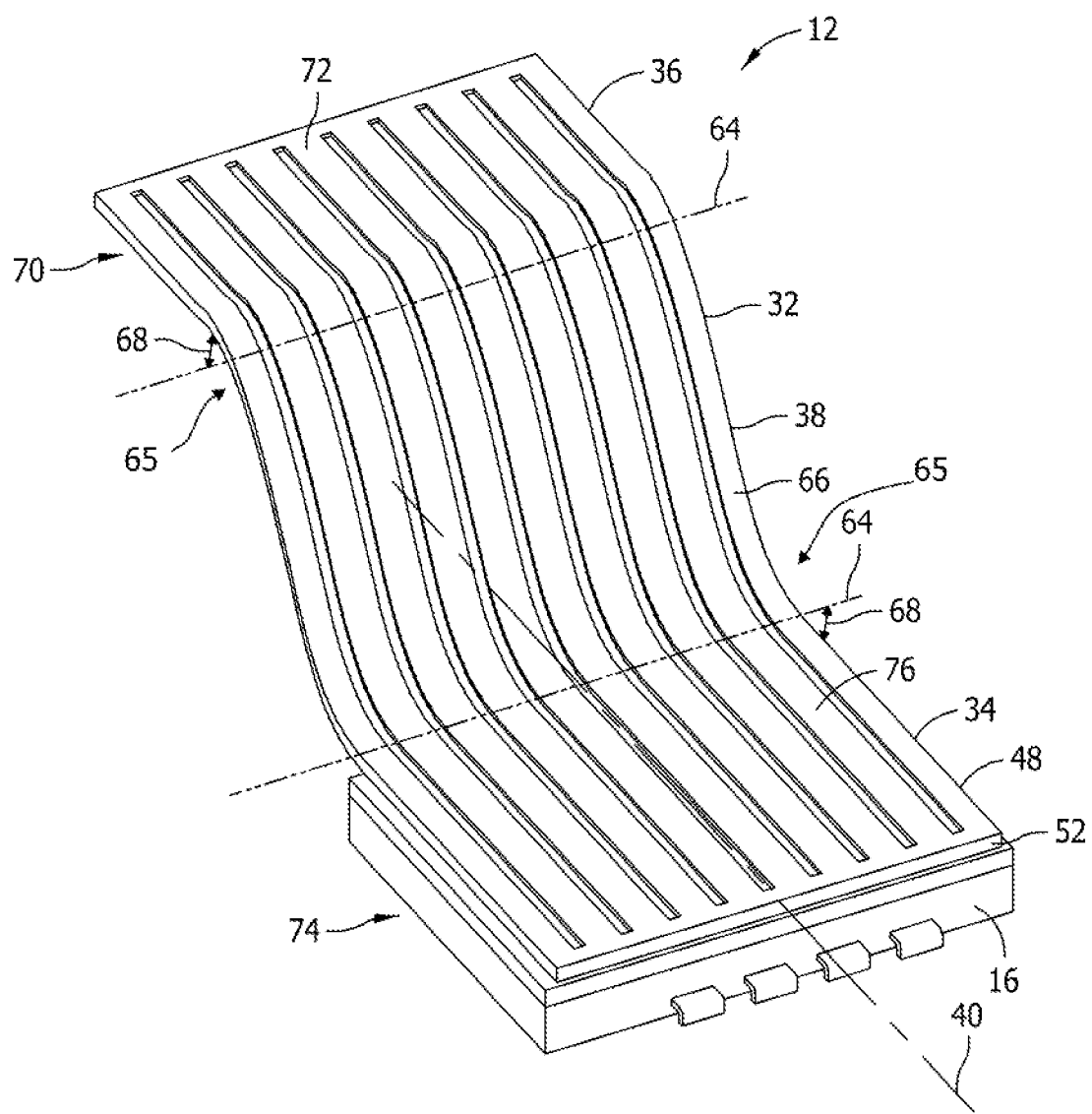
FIG. 2 is a perspective view of an exemplary heat exchange assembly that may be used with the electrical device shown in FIG. 2.
Figure 3:
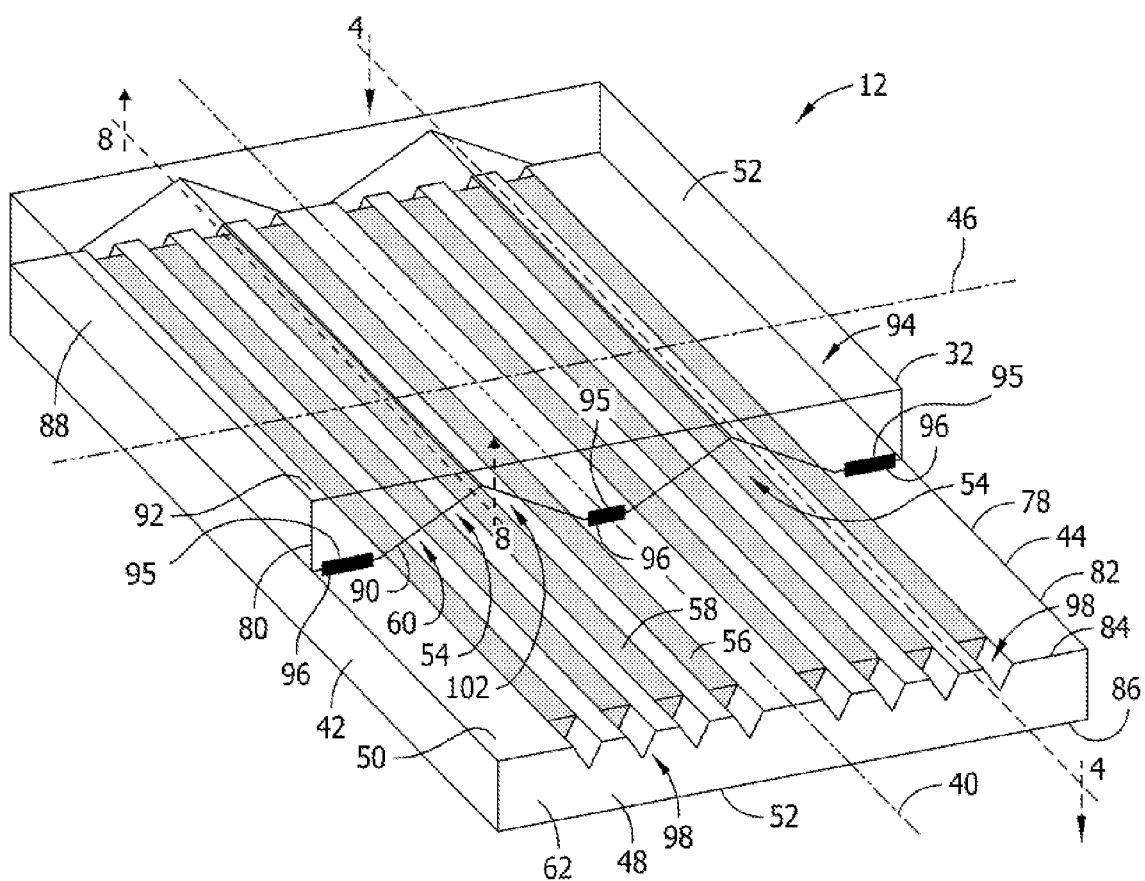
FIG. 3 is a schematic view of the heat exchange assembly shown in FIG. 3.

FIG. 1 is an exploded partial perspective view of an exemplary electrical device 10. FIG. 2 is a perspective view of an exemplary heat exchange assembly 12. FIG. 3 is a schematic view of heat exchange assembly 12. In the exemplary embodiment, electrical device 10 includes a housing 14, at least one electrical component 16, and a heat exchange assembly 12. Housing 14 includes a sidewall 18 that includes a radially inner surface 20 and a radially outer surface 22. Housing inner surface 20 defines a cavity 24 therein. At least one support member 26 is positioned within cavity 24 and is coupled to housing inner surface 20. Electrical component 16 is coupled to support member 26 such that electrical component 16 is supported from housing 14 with support member 26. In one embodiment, support member 26 may be, for example, a printed circuit board.

In the exemplary embodiment, heat exchange assembly 12 is coupled to electrical component 16, and to housing 14 to facilitate transferring heat from electrical component 16 to housing 14 to adjust a temperature of electrical component 16. More specifically, electrical component 16 is configured to generate heat during operation of electrical device 10. Heat exchange assembly 12 is oriented to facilitate transferring heat from electrical device 10 to housing 14 and cool electrical component 16 during operation of electrical device 10. In the exemplary embodiment, housing 14 includes at least one heat sink assembly 28 that is coupled to housing sidewall 18. Heat sink assembly 28 is configured to transfer heat to ambient air 30, and heat exchange assembly 12 is coupled between electrical component 16 and heat sink assembly 28.

In the exemplary embodiment, heat exchange assembly 12 includes a casing 32 that includes an evaporator section 34, a condenser section 36, and a transport section 38 that extends between evaporator section 34 and condenser section 36. Casing 32 extends between condenser section 36 and evaporator section 34 along a longitudinal axis 40, and includes a length 41 measured between condenser section 36 and evaporator section 34 along axis 40. In addition, casing extends between a first side 42 and a second side 44 along a transverse axis 46 that is substantially perpendicular to longitudinal axis 40, and includes a width 47 measured between first side 42 and second side 44 along axis 46. In the exemplary embodiment, length 41 is larger than width 47. Alternatively, length 41 may be less than, or approximately equal to, width 47. Casing 32 also includes at least one sidewall 48 that includes a radially inner surface 50 and a radially outer surface 52. Sidewall inner surface 50 defines at least one fluid chamber 54 that extends between evaporator section 34 and condenser section 36 along longitudinal axis 40. More specifically, fluid chamber 54 extends from evaporator section 34, through transport section 38, to condenser section 36 to channel a working fluid 56 between evaporator section 34 and condenser section 36 through transport section 38. In the exemplary embodiment, heat exchange assembly 12 is a closed system that channels working fluid 56 between evaporator section 34 and condenser section 36 to facilitate reducing a temperature of electrical component 16. Moreover, heat exchange assembly 12 facilitates converting working fluid 56 to a liquid fluid 58 and a gaseous fluid 60 to facilitate transferring heat from electrical component 16 to heat sink assembly 28.

Evaporator section 34 is coupled to electrical component 16 to facilitate transferring heat from electrical component 16 to working fluid 56, and converting at least a portion of liquid fluid 58 to gaseous fluid 60. Condenser section 36 is coupled to housing 14 to facilitate transferring heat from working fluid 56 to housing 14 to facilitate reducing a temperature of working fluid 56 within condenser section 36. Condenser section 36 facilitates transferring heat from gaseous fluid 60 to housing 14 to facilitate converting at least a portion of gaseous fluid 60 to liquid fluid 58. Moreover, condenser section 36 is coupled to heat sink assembly 28 to facilitate transferring heat from working fluid 56 to ambient air 30. Transport section 38 is coupled between evaporator section 34 and condenser section 36 to channel working fluid 56 between evaporator section 34 and condenser section 36 to enable heat exchange assembly 12 to transfer heat from electrical component 16 to heat sink assembly 28.

In the exemplary embodiment, at least a portion of transport section 38 includes a sidewall 48 that includes a substrate material 62 that enables sidewall 48 to flex and/or bend about a bending axis 64. Substrate material 62 may include, but is not limited to, a copper, an aluminum, a plastic, and/or any suitable material that enables heat exchange assembly 12 to function as described herein. In one embodiment, condenser section 36 and/or evaporator section 34 also include flexible substrate material 62. In another embodiment, condenser section 36 and/or evaporator section 34 may include a rigid, non-flexible substrate material. In the exemplary embodiment, transport section 38 includes one or more bending regions 65 that are configured to bend and/or flex about bending axis 64. Bending axis 64 is oriented with respect to bending region 65 such that at least a portion of an outer surface 66 of transport section 38 is oriented circumferentially about bending axis 64, and includes a bending radius 68 measured between bending axis 64 and transport outer surface 66. More specifically, condenser section 36 defines a first plane 70 (shown in FIG. 2) that is oriented substantially tangentially with respect to an outer surface 72 of condenser section 36, and evaporator section 34 defines a second plane 74 that is oriented substantially tangentially with respect to an outer surface 76 of evaporator section 34. Casing 32 is configured to bend about bending axis 64 such that condenser section 36 and evaporator section 34 are not oriented within the same reference plane. In one embodiment, casing 32 is configured to bend along a bending axis 64 that is oriented substantially perpendicular to longitudinal axis 40. In another embodiment, casing 32 is configured to flex and/or twist along a bending axis 64 that is oriented obliquely with respect to longitudinal axis 40. Moreover, casing 32 may be configured to bend about a plurality of bending axes 64 oriented with respect to transport section 38.

In the exemplary embodiment, casing 32 includes a first sidewall 78 and a second sidewall 80. First sidewall 78 includes a substantially flat plate 82 that extends between an inner surface 84 and an outer surface 86. Similarly, second sidewall 80 includes a substantially flat plate 88 that extends between an inner surface 90 and an outer surface 92. Second sidewall 80 is coupled to first sidewall 78 such that fluid chamber 54 is defined between first sidewall inner surface 84 and second sidewall inner surface 90. In one embodiment, second sidewall 80 is coupled to first sidewall 78 such that a pair 94 of fluid chambers 54 are defined between first sidewall 78 and second sidewall 80. Each fluid chamber 54 extends between condenser section 36 and evaporator section 34 through transport section 38. In the exemplary embodiment, first sidewall 78 is coupled to second sidewall 80 in a sealing arrangement to seal fluid chamber 54, and to prevent working fluid 56 from being discharged from casing 32 such that heat exchange assembly 12 is a closed, sealed system. In the exemplary embodiment, casing 32 also includes at least one support assembly 95 coupled between first sidewall 78 and second sidewall 80 to increase a stiffness of casing 32. Support assembly 95 extends between condenser section 36 and evaporator section 34 along longitudinal axis 40, and is oriented between casing first side 42 and casing second side 44 such that fluid chamber 54 is at least partially defined by support assembly 95. Support assembly 95 is oriented to increase a stiffness of casing 32 to facilitate preventing a collapse of fluid chamber 54. In addition, each support assembly 95 includes a sealing assembly 96 coupled between first sidewall 78 and second sidewall 80 to couple first sidewall 78 to second sidewall 80 in a sealing arrangement. In one embodiment, at least one sealing assembly 96 is positioned between each fluid chamber 54 such that each fluid chamber 54 is a closed, sealed system, and working fluid 56 is prevented from being channeled to adjacent fluid chambers 54.

In the exemplary embodiment, casing 32 includes a plurality of fluid capillary channels 98 that are defined within first sidewall inner surface 84. Each capillary channel 98 extends between condenser section 36 and evaporator section 34, and includes a length 100 (shown in FIG. 6) measured between condenser section 36 and evaporator section 34 along longitudinal axis 40. Each capillary channel 98 is configured to channel a flow of liquid fluid 58 from condenser section 36, through transport section 38, to evaporator section 34. In addition, heat exchange assembly 12 includes at least one vapor channel 102 that is defined within second sidewall inner surface 90, and extends between condenser section 36 and evaporator section 34. Each vapor channel 102 includes a length 104 (shown in FIG. 6) between condenser section 36 and evaporator section 34 measured along longitudinal axis 40. Each vapor channel 102 is configured to channel a flow of gaseous fluid 60 from evaporator section 34 to condenser section 36 through transport section 38. Moreover, vapor channel 102 is coupled in flow communication with each capillary channel 98 such that a liquid-gas interface region 106 (shown in FIG. 6) is defined between vapor channel 102 and each capillary channel 98. Liquid-gas interface region 106 extends continuously between condenser section 36 and evaporator section 34, and generates additional surface tension-driven flow from the condenser section 34 to the evaporator section 36.

During operation, one or more capillary channels 98 channel liquid fluid 58 from condenser section 36 to evaporator section 34. Evaporator section 34 facilitates transferring heat from electrical component 16 to working fluid 56 to facilitate converting at least a portion of liquid fluid 58 to gaseous fluid 60. Vapor channel 102 channels gaseous fluid 60 from evaporator section 34 to condenser section 36. Condenser section 36 facilitates transferring heat from gaseous fluid 60 to heat sink assembly 28 to facilitate converting at least a portion of gaseous fluid 60 to liquid fluid 58.

Figure 4:
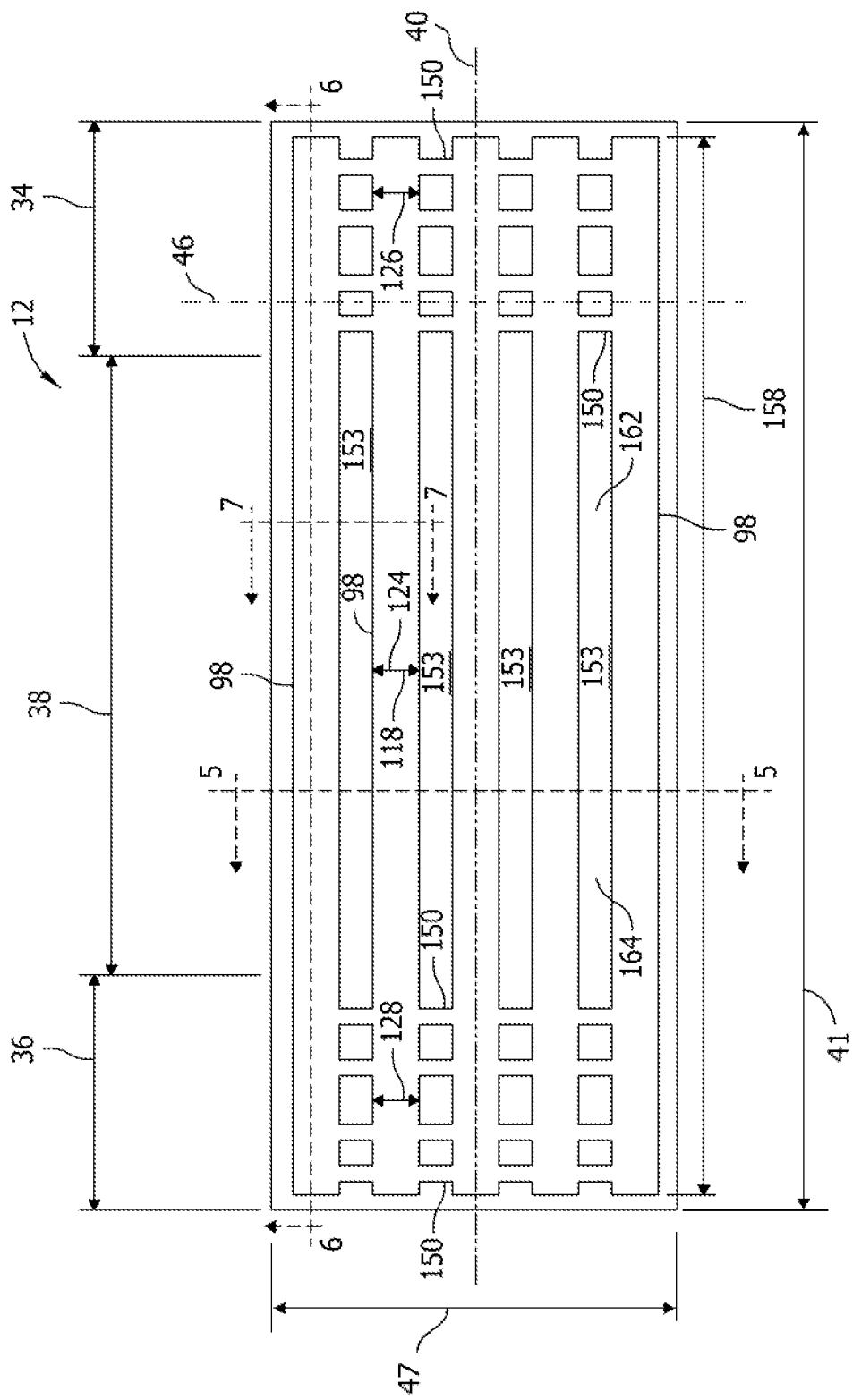
FIG. 4 is a sectional view of the heat exchange assembly shown in FIG. 3 and taken along line 4-4.
Figure 5:
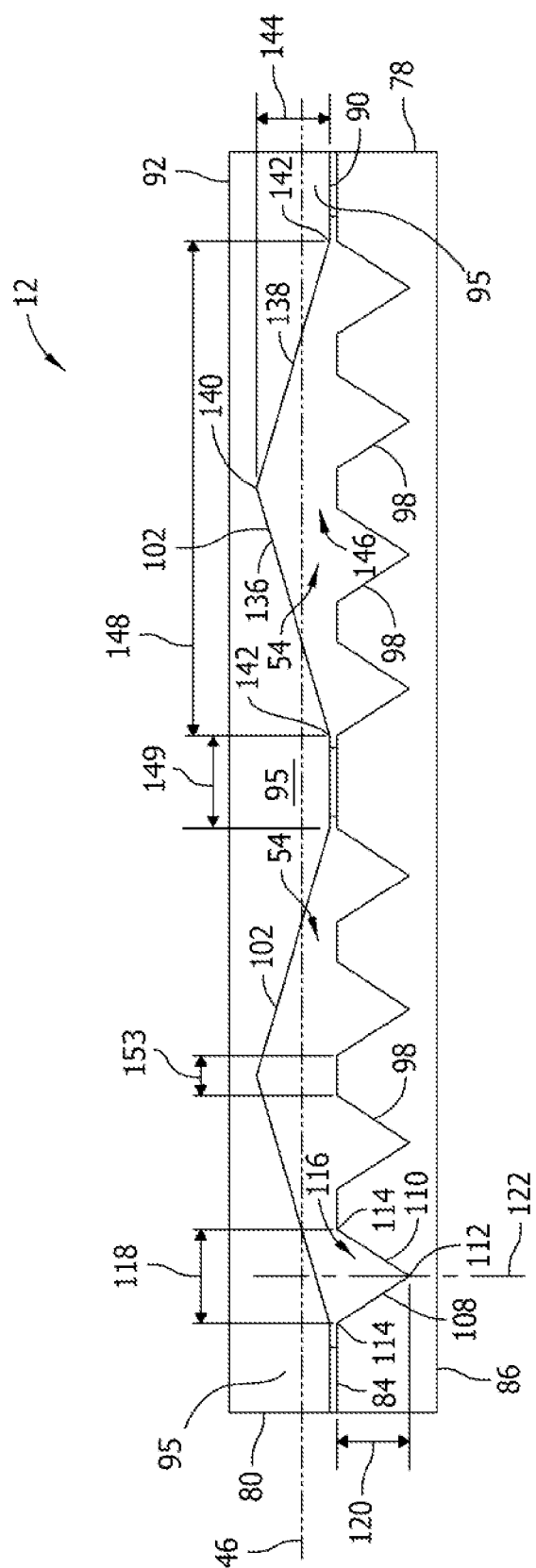
FIG. 5 is a sectional view of the heat exchange assembly shown in FIG. 2 and taken along line 5-5.
Figure 6:
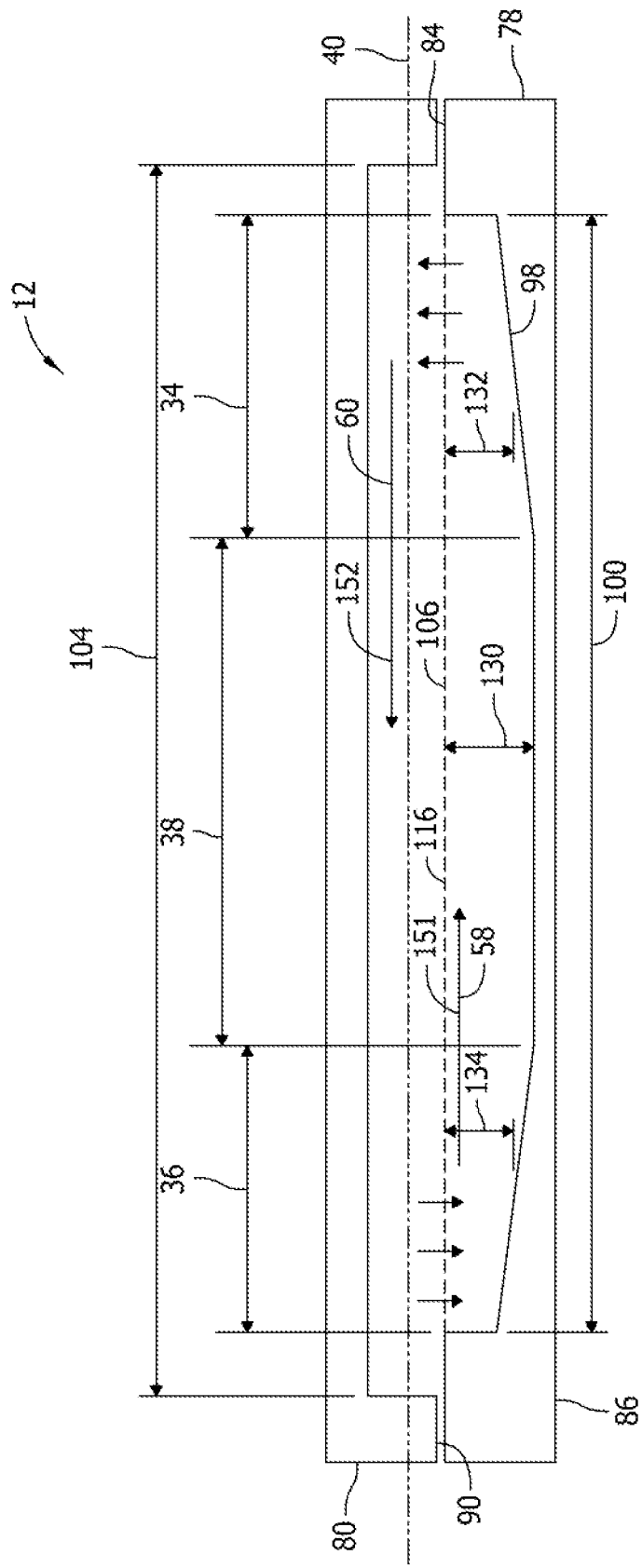
FIG. 6 is a sectional view of the heat exchange assembly shown in FIG. 2 and taken along line 6-6.

FIG. 4 is a sectional view of heat exchange assembly 12 taken along line 4-4 shown in FIG. 3. FIG. 5 is a sectional view of heat exchange assembly 12 taken along line 5-5 shown in FIG. 4. FIG. 6 is a sectional view of heat exchange assembly 12 taken along line 6-6 shown in FIG. 4. Identical components shown in FIGS. 4-6 are labeled with the same reference numbers used in FIGS. 1-3. In the exemplary embodiment, each fluid chamber 54 includes a vapor channel 102 and a plurality of capillary channels 98. Each capillary channel 98 includes a first side surface 108 and a second side surface 110. Each first side surface 108 and second side surface 110 extends between a base portion 112 and an end portion 114. Each end portion 114 is oriented adjacent first sidewall inner surface 84. Each base portion 112 extends outwardly from end portion 114 towards first sidewall outer surface 86.

Adjacent end portions 114 are axially-spaced apart along transverse axis 46 such that capillary channel 98 includes an open portion 116 that has a width 118 measured between adjacent end portions 114 along transverse axis 46. In addition, each capillary channel 98 includes a depth 120 measured between first sidewall inner surface 84 and base portion 112 along a radial axis 122 defined between first sidewall inner surface 84 and first sidewall outer surface 86. Moreover, adjacent end portions 114 are axially spaced apart such that capillary channel 98 has a v-shaped cross-section that extend from base portion 112 to open portion 116 to facilitate converting liquid fluid 58 into gaseous fluid 60 in evaporator section 34, and to facilitate converting gaseous fluid 60 into liquid fluid 58 in condenser section 36. In addition, capillary channel 98 is configured to increase a thin film region of the evaporating meniscus of working fluid 56. Alternatively, each capillary channel 98 may have a shape including one of a hemispherical, hemi-cylindrical, triangular, rectangular, trapezoidal, and/or any suitable shape that enables heat exchange assembly 12 to function as described herein. In the exemplary embodiment, capillary channel 98 includes a cross-sectional shape through bending region 65 (shown in FIG. 2) that is selected such that the capillary channel cross-sectional shape does not deform or change as capillary channel 98 extends through bending region 65. More specifically, capillary channel width 118 is selected such that channel width 118 does not vary through bending region 65, and as casing 32 bends about bending axis 64. In addition, each capillary channel 98 is oriented substantially perpendicular to bending axis 64 within bending region 65 to enable each capillary channel 98 to bend about bending axis 64, and include a capillary channel width 118 that is substantially the same throughout bending region 65. In the exemplary embodiment, channel width 118 is approximately equal to between about 1 μm to about 1 mm. Alternatively, channel width 118 may be less than 1 μm, or greater than 1 mm.

At least one capillary channel 98 includes a variable width 118 between evaporator section 34, transport section 38, and condenser section 36. More specifically, at least one capillary channel 98 includes a first width 124 (shown in FIG. 4) defined within transport section 38, and a second width 126 (shown in FIG. 4) defined within evaporator section 34 that is different than first width 124. In the exemplary embodiment, first width 124 is larger than second width 126 to facilitate converting liquid fluid 58 to gaseous fluid 60 in evaporator section 34. Alternatively, first width 124 may be less than, or equal to, second width 126. In addition, in one embodiment, capillary channel 98 includes a third width 128 defined within condenser section 36. In the exemplary embodiment, third width 128 is less than first width 124 to facilitate channeling liquid fluid 58 from condenser section 36 to evaporator section 34. Alternatively, third width 128 may be greater than, or equal to first width 124.

In addition, at least one capillary channel 98 includes a variable depth 120 between condenser section 36 and evaporator section 34 to increase fluid velocity from condenser section 36 to transport section 38, and from transport section 38 to evaporator section 34. More specifically, at least one capillary channel 98 includes a first depth 130 defined within transport section 38, a second depth 132 defined within evaporator section 34, and a third depth 134 defined within condenser section 36. In the exemplary embodiment, first depth 130 is greater than second depth 132 and third depth 134. Alternatively first depth 130 may be less than, or equal to second depth 132 and/or third depth 134. Moreover, in the exemplary embodiment, second depth 132 is greater than third depth 134. In another embodiment, second depth 132 may be less than, or equal to third depth 134.

In the exemplary embodiment, each vapor channel 102 includes a first side 136 and a second side 138. Each first side 136 and second side 138 extends between a base end 140 and an upper end 142. Each upper end 142 is oriented adjacent to second sidewall inner surface 90. Each base end 140 extends outwardly from upper end 142 towards second sidewall outer surface 92. Vapor channel 102 includes a depth 144 measured between second sidewall inner surface 90 and base end 140 along radial axis 122. In addition, adjacent upper ends 142 are axially spaced apart along transverse axis 46 such that vapor channel 102 includes an open end 146 that has a width 148 measured between adjacent upper ends 142. Moreover, adjacent upper ends 142 are axially spaced apart to define a chevron-shaped vapor channel 102. Alternatively, vapor channel 102 may have a shape including one of a hemispherical, hemi-cylindrical, triangular, rectangular, trapezoidal, and/or any suitable shape that enables heat exchange assembly 12 to function as described herein. In the exemplary embodiment, vapor channel 102 extends across each capillary channel 98. More specifically, vapor channel open end 146 extends across each capillary channel open portion 116 such that liquid-gas interface region 106 is defined between vapor channel 102 and each capillary channel 98. Moreover, each vapor channel 102 is defined between adjacent support assemblies 95 such that adjacent support assemblies 95 at least partially define a corresponding vapor channel 102. In addition, at least one support assembly 95 includes a width 149 measured between adjacent vapor channels 102 along transverse axis 46. In one embodiment, support assembly width 149 varies from condenser section 36 to evaporator section 34 such that a corresponding vapor channel width 148 also varies between condenser section 36 and evaporator section 34.

In the exemplary embodiment, each condenser section 36 and evaporator section 34 includes a plurality of connecting channels 150 that extend between each capillary channel 98 to couple each capillary channel 98 in flow communication with an adjacent capillary channel 98. Each connecting channel 150 is defined within first sidewall inner surface 84 and has a size and shape that is similar to capillary channel 98. In one embodiment, each connecting channel 150 is oriented substantially perpendicular to each capillary channel 98. In another embodiment, at least one connecting channel 150 is oriented obliquely with respect to at least one capillary channel 98.

In the exemplary embodiment, heat exchange assembly 12 includes a first working fluid 151 and a second working fluid 152 that is different than first working fluid 151 such that working fluid 56 includes a positive surface tension gradient with respect to fluid temperature. More specifically, first working fluid 151 includes a first aqueous solution having a first vapor pressure, and second working fluid 152 includes a miscible fluid having a second vapor pressure that is different than first vapor pressure. For example, in one embodiment, first working fluid 151 includes water, and second working fluid 152 includes an alcohol. In the exemplary embodiment, heat exchange assembly 12 includes a concentration of second working fluid 152 that varies between condenser section 36 and evaporator section 34. More specifically, evaporator section 34 includes a first concentration of second working fluid 152, and condenser section 36 includes a second concentration of second working fluid 152 that is greater than the first concentration such that a concentration gradient is formed between evaporator section 34 and condenser section 36. The concentration gradient generates a surface tension gradient that facilitates channeling working fluids 151 and 152 from condenser section 36 to evaporator section 34. In addition, in the exemplary embodiment, the aspect ratio (depth and width) of each channel 98 and 102 in transport section 38 is selected to increase the surface tension driven flow from evaporator section 34 to condenser section 36, and increase to capillary flow within channels 98 and 102.

Figure 7:
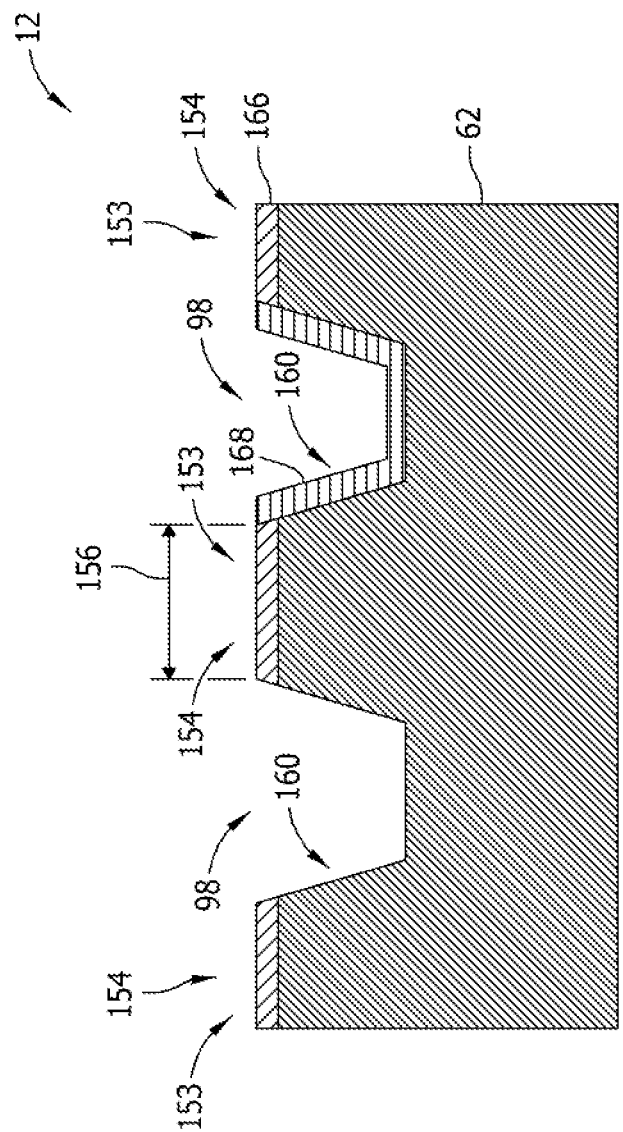
FIG. 7 is cross-sectional view of the heat exchange assembly shown in FIG. 4 and taken along line 7-7.

FIG. 7 is cross-sectional view of heat exchange assembly 12 taken along line 7-7 shown in FIG. 4. Identical components shown in FIG. 7 are labeled with the same reference numbers used in FIGS. 4-6. In the exemplary embodiment, heat exchange assembly 12 also includes a plurality of planar regions 153 oriented between each capillary channel 98. More specifically, adjacent capillary channels 98 are axially-spaced along transverse axis 46 such that each planar region 153 is oriented between adjacent capillary channels 98. Each planar region 153 includes a hydrophobic region 154 that is configured to channel liquid fluid 58 towards each capillary channel 98. Hydrophobic region 154 includes a width 156 defined between adjacent capillary channels 98, and a length 158 (shown in FIG. 4) measured along longitudinal axis 40. In addition, each capillary channel 98 includes a hydrophilic region 160 to facilitate channeling liquid fluid 58 from condenser section 36 to evaporator section 34. In the exemplary embodiment, each hydrophobic region 154 has a variable width 156 between condenser section 36 and evaporator section 34. In the exemplary embodiment, heat exchange assembly 12 includes a first hydrophobic region 162 (shown in FIG. 4) defined between evaporator section 34 and transport section 38, and a second hydrophobic region 164 (shown in FIG. 4) defined within condenser section 36 that is larger than first hydrophobic region 162.

Each hydrophobic region 154 includes a hydrophobic coating 166 disposed over at least a portion of sidewall substrate 62. In addition, hydrophilic region 160 includes a hydrophilic coating 168 disposed over at least a portion of capillary channel side surfaces 108 and 110. Alternatively, sidewall substrate 62 may include a hydrophilic material, and hydrophobic region 154 includes a hydrophobic coating 166 disposed over at least a portion of hydrophilic substrate 62. In the exemplary embodiment a portion of hydrophobic coating 166 is removed to form capillary channel 98. In one embodiment, sidewall substrate 62 may include a hydrophobic material, and each capillary channel 98 includes a hydrophilic coating 168 disposed over at least a portion of side surfaces 108 and 110.

Figure 8:
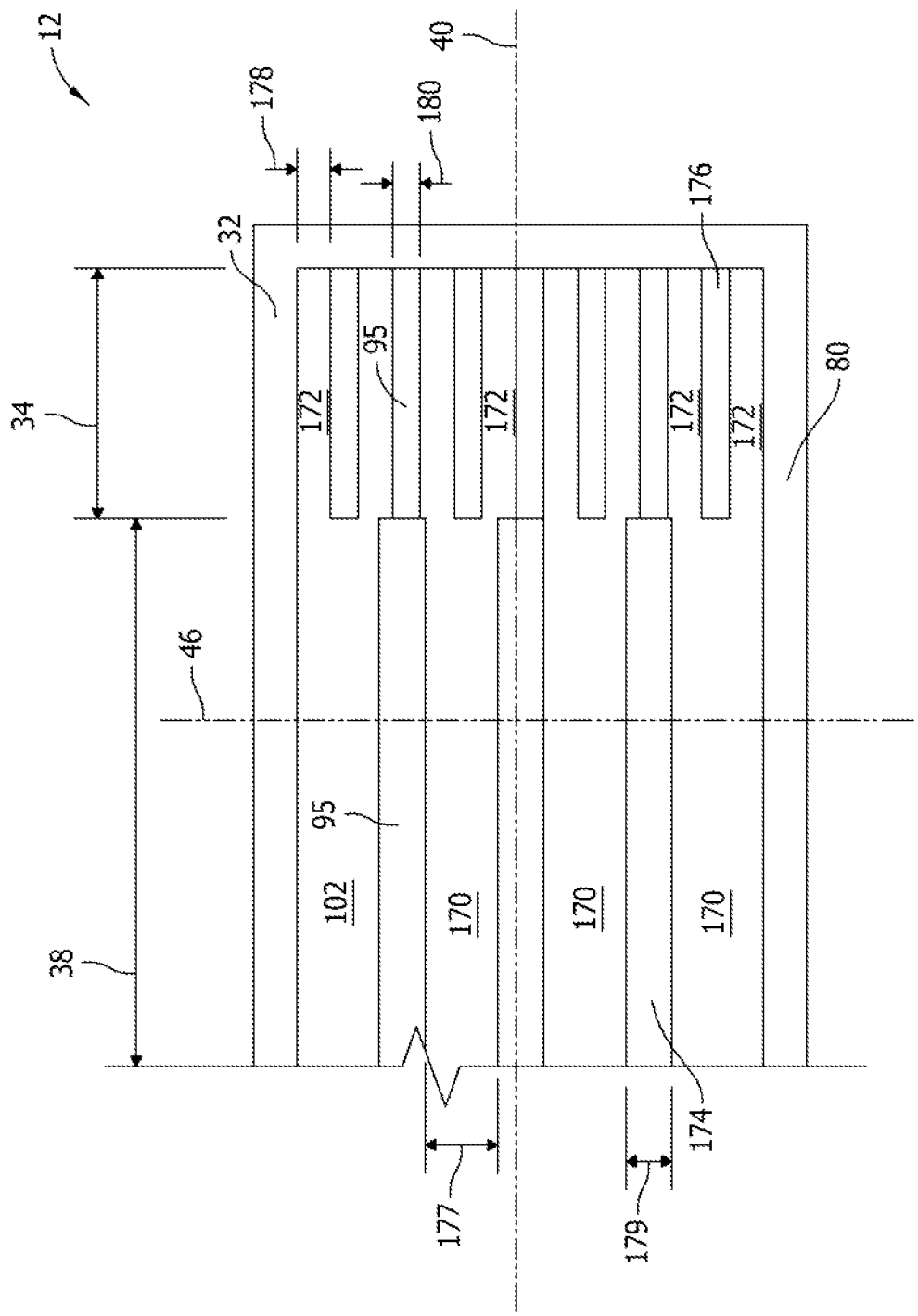
FIG. 8 is a cross-sectional view of the heat exchange assembly shown in FIG. 3 and taken along line 8-8.

FIG. 8 is a cross-sectional view of heat exchange assembly 12 and taken along line 8-8 shown in FIG. 3. Identical components shown in FIG. 8 are labeled with the same reference numbers used in FIGS. 3-7. In an alternative embodiment, heat exchange assembly 12 includes a plurality of first vapor channels 170 and a plurality of second vapor channels 172. In addition, heat exchange assembly 12 includes a plurality of first support assemblies 174 and a plurality of second support assemblies 176. In the exemplary embodiment, each first vapor channel 170 is positioned within transport section 38 and extends between evaporator section 34 and condenser section 36. In addition, each first support assembly 174 is positioned within transport section 38 between condenser section 36 and evaporator section 34. Adjacent first support assemblies 174 and axially-spaced along transverse axis 46 such that each first vapor channel 170 is oriented between adjacent first support assemblies 174. Each first vapor channel 170 includes a first width 177 measured between adjacent first support assemblies 174. In the exemplary embodiment, each second vapor channel 172 is oriented within condenser section 36 and/or evaporator section 34, and is coupled in flow communication with a corresponding first vapor channel 170. In addition, each second support assembly 176 is positioned within evaporator section 34 and condenser section 36. Adjacent second support assemblies 176 are axially-spaced such that each second vapor channel 172 is defined between adjacent second support assemblies 176. In the exemplary embodiment, each second vapor channel 172 includes a second width 178 measured between adjacent second support assemblies 176 that is less than first vapor channel width 177. In addition, each first support assembly 174 includes a first width 179 measured between adjacent first vapor channels 170, and each second support assembly 176 includes a second width 180 measured between adjacent second vapor channels 172 that is smaller than first support assembly width 179. In the exemplary embodiment, heat exchange assembly 12 includes a first amount of first vapor channels 170 within transport section 38, and a second amount of second vapor channels 172 within evaporator section 34 that is greater than the first amount of first vapor channels 170. In addition, in one embodiment, heat exchange assembly 12 includes an amount of second vapor channels 172 within condenser section 36 that is greater than the amount of first vapor channels 170 within transport section 38.

Figure 9:
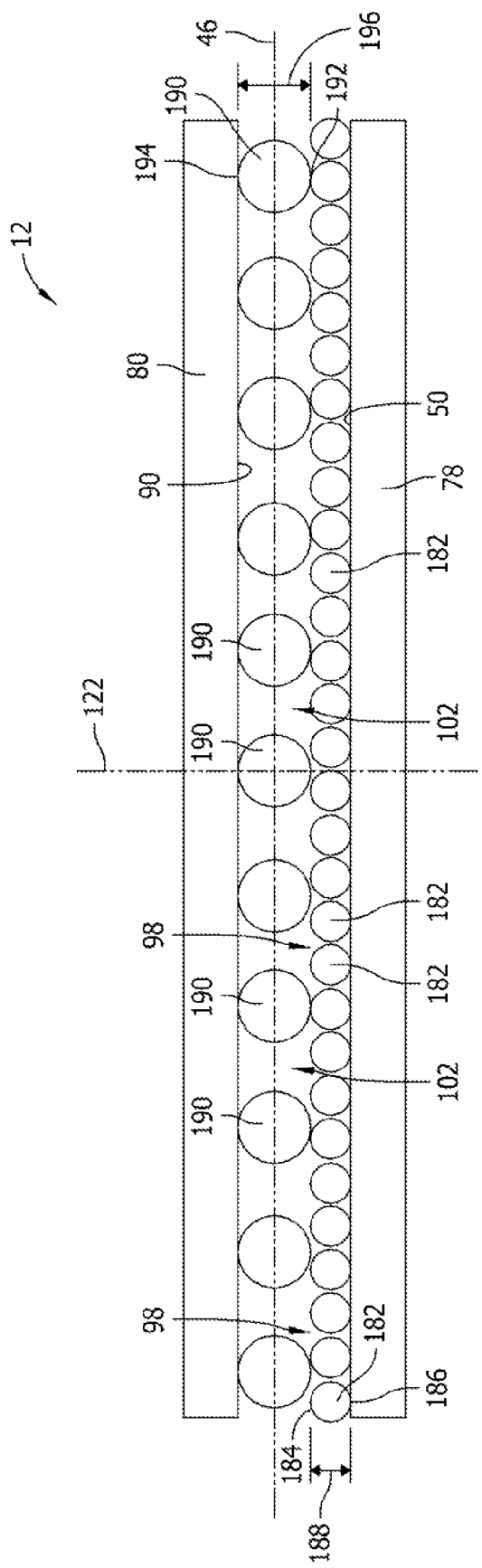
FIG. 9 is a cross-sectional view of an alternative embodiment of the heat exchange assembly shown in FIG. 5.

FIG. 9 is a cross-sectional view of an alternative embodiment of heat exchange assembly 12. Identical components shown in FIG. 9 are labeled with the same reference numbers used in FIGS. 4-7. In an alternative embodiment, heat exchange assembly 12 includes a plurality of first projections 182 that extend outwardly from casing inner surface 50. Each first projection 182 is coupled to first sidewall 78 and extends between condenser section 36 (shown in FIG. 4) and evaporator section 34 (shown in FIG. 4) along longitudinal axis 40 (shown in FIG. 4). Adjacent first projections 182 are axially-spaced along transverse axis 46 such that each capillary channel 98 is defined between adjacent first projections 182. Each first projection 182 extends between a tip end 184 and a base end 186, and has a height 188 measured between tip end 184 and base end 186 along radial axis 122. First projection height 188 corresponds to capillary channel depth 120 (shown in FIG. 5). Heat exchange assembly 12 also includes a plurality of second projections 190 that are coupled to second sidewall 80, and extend between condenser section 36 and evaporator section along longitudinal axis 40. Each second projection 190 extends outwardly from second sidewall inner surface 90 towards first projections 182. Adjacent second projections 190 are axially-spaced along transverse axis 46 such that each vapor channel 102 is defined between adjacent second projection 190. Each second projection 190 extends between a tip end 192 and a base end 194, and includes a height 196 measured between tip end 192 and base end 194. Second projection height 196 corresponds with vapor channel depth 144. In the exemplary embodiment, second projection height 196 is larger than first projection height 188. Alternatively, second projection height 196 may be less than, or approximately equal to, first projection height 188. In one embodiment, each first projection 182 and each second projection 190 may be, for example, a wire, a fiber, and/or any suitable member that enables heat exchange assembly 12 to function as described herein.

Figure 10:
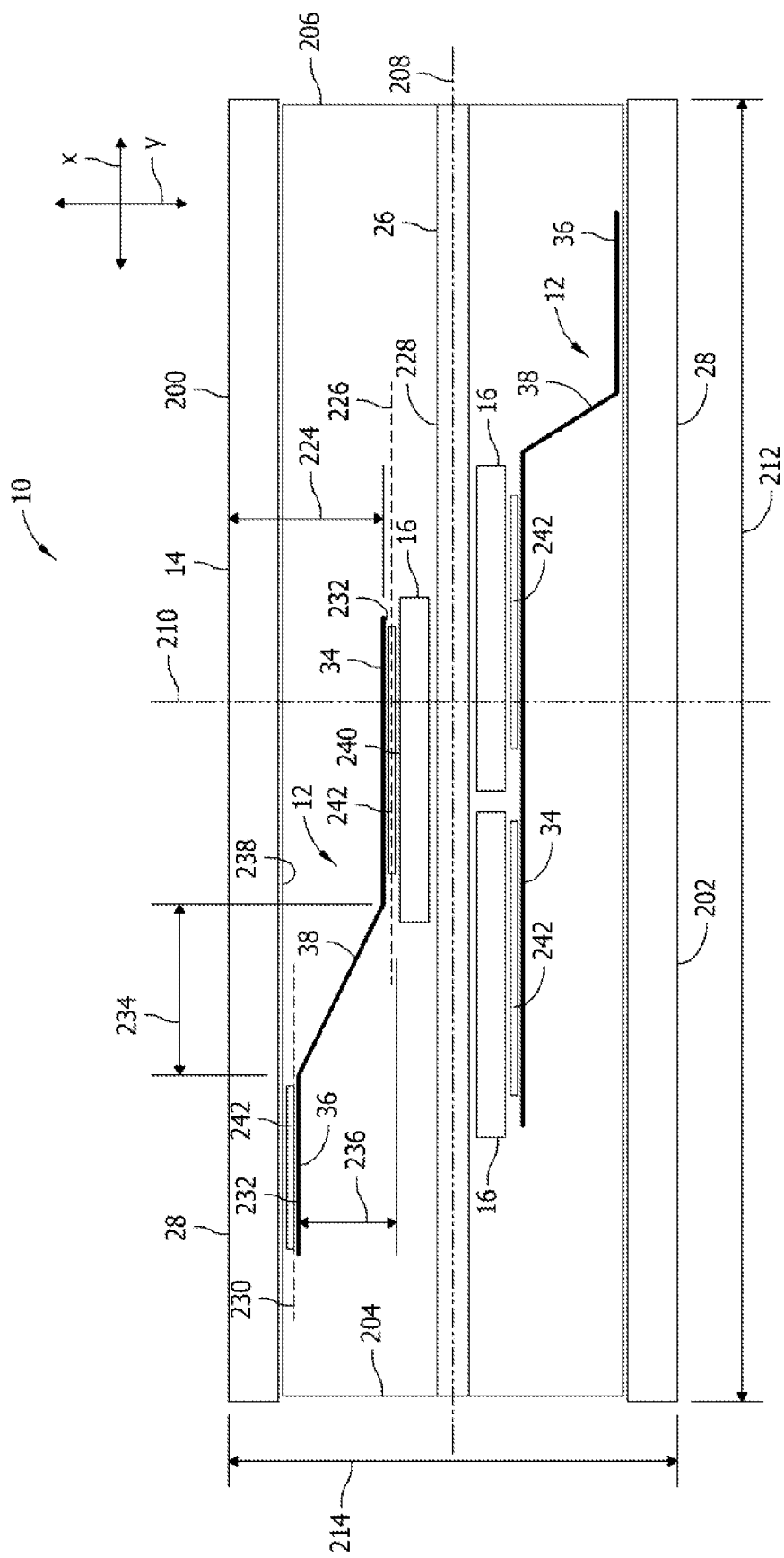
FIG. 10 is a schematic view of the electrical device shown in FIG. 1 and taken along line 10-10.
Figure 11:
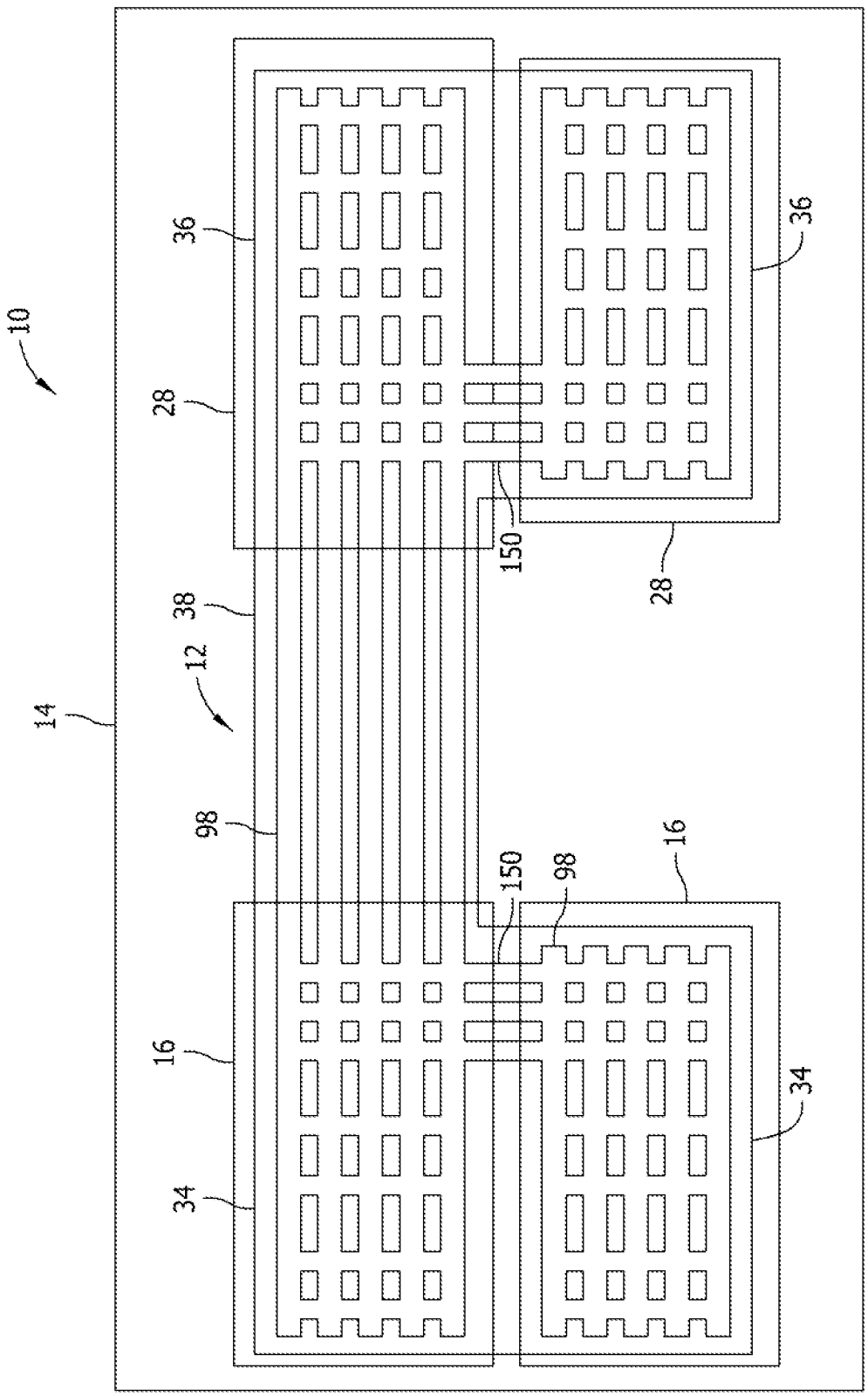
FIG. 11 is schematic top view of the electrical device shown in FIG. 10.

FIG. 10 is a schematic view of electrical device 10 taken along line 10-10 shown in FIG. 1. FIG. 11 is schematic top view of electrical device 10. Identical components shown in FIGS. 10 and 11 are labeled with the same reference numbers used in FIGS. 1-6. In the exemplary embodiment, referring to FIGS. 1, 10, and 11, electrical device housing 14 includes an upper wall 200, a lower wall 202, a first end wall 204, and a second end wall 206. Each upper wall 200 and lower wall 202 extends between first end wall 204 and second end wall 206 and is oriented along a first axis 208 defined between first end wall 204 and second end wall 206. Each first end wall 204 and second end wall 206 extends between upper wall 200 and lower wall 202 along a second axis 210 that is substantially perpendicular to first axis 208. First end wall 204 is spaced a distance 212 from second end wall 206 along first axis 208, and upper wall 200 is spaced a distance 214 from lower wall 202 along second axis 210. In addition, housing 14 includes a first side panel 216 and an opposite second side panel 218. Side panels 216 and 218 each extend between upper wall 200 and lower wall 202, and between first end wall 204 and second end wall 206. First side panel 216 is spaced a distance from second side panel 218 along a third axis 222. In the exemplary embodiment, three perpendicular axes X, Y, and Z are used to define a three-dimensional Cartesian coordinate system relative to electrical device 10. Specifically, the X-axis is oriented to extend substantially coaxially along first axis 208, the Y-axis is oriented to extend substantially coaxially along second axis 210, and the Z-axis is oriented to extend substantially coaxially with third axis 222.

In the exemplary embodiment, support member 26 extends between end walls 204 and 206 and between panels 216 and 218, and is oriented between upper wall 200 and lower wall 202. At least one electrical component 16 is coupled to support member 26 such that electrical component 16 is spaced a distance 224 from upper wall 200 along second axis 210. Moreover, electrical component 16 is oriented within a first reference plane 226 defined by an outer surface 228 of support member 26. Heat sink assembly 28 is coupled to upper wall 200 and is oriented in a second reference plane 230 defined by upper wall 200 that is different than first reference plane 226. In the exemplary embodiment, condenser section 36 and evaporator section 34 each has a substantially planar outer surface 232. Evaporator section 34 is coupled to electrical component 16 such that evaporator section 34 is oriented within first reference plane 226, and condenser section 36 is coupled to heat sink assembly 28 such that condenser section 36 is oriented within second reference plane 230. Heat exchange assembly 12 is coupled between electrical component 16 and heat sink assembly 28 such that condenser section 36 is spaced a first distance 234 from evaporator section 34 along first axis 208, and is spaced a second distance 236 from evaporator section 34 along second axis 210. In one embodiment, condenser section 36 is coupled to an inner surface 238 of upper wall 200, and evaporator section 34 is coupled to an outer surface 240 of electrical component 16.

In addition, heat exchange assembly 12 extends between electrical component 16 and housing 14 such that transport section 38 is oriented obliquely with respect to condenser section 36 and/or evaporator section 34. In one embodiment, evaporator section 34 is oriented substantially parallel to condenser section 36. In another embodiment, evaporator section 34 may be oriented obliquely with respect to condenser section 36, or oriented substantially perpendicular to condenser section 36. In the exemplary embodiment, a thermal interface material 242 is coupled between condenser section 36 and heat sink assembly 28, and between evaporator section 34 and electrical component 16. Thermal interface material 242 is configured to facilitate transferring heat from electrical component 16 to evaporator section 34, and from condenser section 36 to heat sink assembly 28.

In the exemplary embodiment, heat sink assembly 28 includes a plurality of fins 244 that extend outwardly from upper wall 200 and/or lower wall 202. Alternatively, heat sink assembly 28 may be formed integrally with upper wall 200 and/or lower wall 202. In another embodiment, electrical device 10 includes a plurality of heat sink assemblies 28, and a plurality of electrical components 16. Heat exchange assembly 12 is coupled to each electrical component 16, and includes a plurality of evaporator sections 34 that extend outwardly from transport section 38. Each evaporator section 34 is coupled to a corresponding electrical component 16 to facilitate transferring heat from each component 16 to heat sink assembly 28. In addition, heat exchange assembly 12 includes a plurality of condenser sections 36 that are coupled to each heat sink assembly 28 to facilitate transferring heat from each electrical component 16 to one or more heat sink assemblies 28.

The above-described systems and methods overcome at least some disadvantages of known electrical devices by providing a heat exchange assembly that includes a flexible casing coupled between an electrical component and a heat sink to facilitate transferring heat from the electrical component to the heat sink. In addition, the heat exchange assembly includes a condenser section, an evaporator section, and one or more fluid channels that channel a working fluid between the condenser section and the evaporator section to facilitate transferring heat from the electrical component to the working fluid, and transferring heat from the working fluid to the heat sink. By providing a flexible heat exchange assembly that channels working fluid between the electrical component and the heat sink, an amount of heat transferred from the component to the heat sink is increased over known electrical devices. As such the operating efficiency of the electrical component is increased, and the cost of maintaining the electrical device is reduced.

Exemplary embodiments of a heat exchange assembly for use with an electrical device and methods of assembling an electrical device are described above in detail. The systems and methods are not limited to the specific embodiments described herein, but rather, components of systems and/or steps of the method may be utilized independently and separately from other components and/or steps described herein. For example, the systems and method may also be used in combination with other electrical devices, and are not limited to practice with only the electrical device as described herein. Rather, the exemplary embodiment can be implemented and utilized in connection with many other heat transfer applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electrical device comprising:
   a housing comprising a housing inner surface that defines a cavity;
   a heat sink coupled to said housing and oriented along a first plane;
   at least one electrical component positioned within said housing cavity, said electrical component oriented along a second plane that is different than the first plane; and
   a heat exchange assembly coupled to said electrical component and said heat sink for adjusting a temperature of said electrical component, said heat exchange assembly comprising an evaporator section, a condenser section, and a transport section extending between said evaporator section and said condenser section for channeling a gaseous fluid of a working fluid between said evaporator section and said condenser section and for channeling a liquid fluid of the working fluid between said condenser section and said evaporator section, said heat exchange assembly is configured to bend along at least one bending axis oriented with respect to said transport section, wherein the heat exchange assembly further comprises:
   at least one sidewall having a sidewall inner surface;
   a plurality of fluid channels defined within said sidewall inner surface to channel the liquid fluid from said condenser section to said evaporator section; and
   at least one vapor channel defined within said sidewall inner surface to channel the gaseous fluid from said evaporator section to said condenser section;
   wherein said at least one vapor channel comprises a first side and a second side, said first side extends between a base end and an upper end and said second side extends between said base end and an adjacent upper end, said upper end and said adjacent upper end located on said sidewall inner surface, said upper end and said adjacent upper end are axially spaced along a transverse axis such that said at least one vapor channel comprises a width of each vapor channel measured between said upper end and said adjacent upper end and extends across at least one of the fluid channels, and wherein each vapor channel and each fluid channel extend continuously only along a longitudinal axis from said evaporator section to said condenser section, and
   wherein the plurality of fluid channels is on only one side of the at least one vapor channel.

2. The electrical device in accordance with claim 1, wherein said evaporator section is coupled to said at least one electrical component for transferring heat from said electrical component to the working fluid, and said condenser section is coupled to said housing inner surface for transferring heat from the working fluid to the housing.

3. The electrical device in accordance with claim 1, wherein said at least one vapor channel is coupled to said plurality of fluid channels such that a liquid-gas interface region is defined between said at least one vapor channel and said plurality of fluid channels, said liquid-gas interface region extends from said condenser section to said evaporator section.

4. The electrical device in accordance with claim 1, wherein each fluid channel of said plurality of fluid channels comprises a first side surface and a second side surface, each first side surface extends between a base portion and an end portion and each second side surface extends between a base portion and an adjacent end portion, said end portion and said adjacent end portion located on said sidewall inner surface such that each fluid channel includes a depth measured between said base portion and said end portion.

5. The electrical device in accordance with claim 4, wherein the depth includes a first depth and a second depth, at least one fluid channel of said plurality of fluid channels has the first depth within said transport section, and the second depth within said evaporator section that is different than said first depth.

6. The electrical device in accordance with claim 4, wherein said adjacent end portion and said adjacent end portion are axially-spaced along said transverse axis such that said fluid channel includes a width of each fluid channel measured between said end portion and said adjacent end portion.

7. The electrical device in accordance with claim 6, wherein the width of each fluid channel includes a first width and a second width, at least one fluid channel of said plurality of fluid channels has the first width within said transport section, and the second width within said evaporation section that is different than said first width.

8. The electrical device in accordance with claim 1, wherein said heat exchange assembly further comprises a plurality of planar regions, each planar region of said plurality of planar regions oriented between one of the fluid channels and an adjacent one of the fluid channels, each planar regions comprising a hydrophobic region, said each fluid channel of said plurality of fluid channels comprising a hydrophilic region.

9. The electrical device in accordance with claim 1, wherein said working fluid includes a first working fluid and a second working fluid, wherein the first working fluid includes a first vapor pressure value, the second working fluid includes a second vapor pressure value that is different from the first vapor pressure value.

10. An electrical device comprising:
   at least one electrical component;
   a heat sink assembly; and
   a heat exchange assembly coupled to said electrical component and said heat sink assembly for adjusting a temperature of said electrical component, said heat exchange assembly comprising a casing comprising an evaporator section coupled to said at least one component, a condenser section coupled to said heat sink assembly, and a transport section extending between said evaporator section and said condenser section along a longitudinal axis, said casing configured to bend along a bending axis that is substantially perpendicular to the longitudinal axis, wherein the heat exchange assembly further comprises:
   at least one sidewall having a sidewall inner surface;
   a plurality of fluid channels defined within said sidewall inner surface to channel a liquid fluid from said condenser section to said evaporator section; and
   at least one vapor channel defined within said sidewall inner surface to channel a gaseous fluid from said evaporator section to said condenser section;
   wherein said at least one vapor channel comprises a first side and a second side, said first side extends between a base end and an upper end and said second side extends between said base end and an adjacent upper end, said upper end and said adjacent upper end located on said sidewall inner surface, said upper end and said adjacent upper end are axially spaced along a transverse axis such that said at least one vapor channel comprises a width of each vapor channel measured between said upper end and said adjacent upper end and extends across at least one of the fluid channels, and wherein each vapor channel and each fluid channel extend continuously only along the longitudinal axis from said evaporator section to said condenser section, and
   wherein the plurality of fluid channels is on only one side of the at least one vapor channel.

11. The electrical device in accordance with claim 10, wherein said at least one vapor channel is coupled to said plurality of fluid channels such that a liquid-gas interface region is defined between said at least one vapor channel and said plurality of fluid channels, said liquid-gas interface region extends from said condenser section to said evaporator section.

12. The electrical device in accordance with claim 10, further comprising a thermal interface material coupled between said evaporator section and said electrical component.

13. A method of assembling an electrical device comprising:
   providing a housing including a housing inner surface that defines a cavity therein;
   coupling an electrical component to the housing inner surface; and
   coupling a heat exchange assembly to the electrical component and the housing for adjusting a temperature of the electrical component, the heat exchange assembly including at least one sidewall having a sidewall inner surface, that includes an evaporator section, a condenser section, and a transport section extending between the evaporator section and the condenser section for channeling a gaseous fluid of a working fluid between said evaporator section and said condenser section and for channeling a liquid fluid of the working fluid between said condenser section and said evaporator section, the at least one sidewall configured to bend along at least one bending axis oriented with respect to the transport section, wherein the sidewall inner surface further comprises:
   a plurality of fluid channels defined within said sidewall inner surface to channel the liquid fluid from said condenser section to said evaporator section; and
   at least one vapor channel defined within said sidewall inner surface to channel the gaseous fluid from said evaporator section to said condenser section;
   wherein said at least one vapor channel comprises a first side and a second side, said first side extends between a base end and an upper end and said second side extends between said base end and an adjacent upper end, said upper end and said adjacent upper end located on said sidewall inner surface, said upper end and said adjacent upper end are axially spaced along a transverse axis such that said at least one vapor channel comprises a width of each vapor channel measured between said upper end and said adjacent upper end and extends across at least one of the fluid channels, and wherein each vapor channel and each fluid channel extend continuously only along a longitudinal axis from said evaporator section to said condenser section, and
   wherein the plurality of fluid channels is on only one side of the at least one vapor channel.

14. The method in accordance with claim 13, further comprising:

coupling the evaporator section to the electrical component; and coupling the condenser section to the housing inner surface to facilitate transferring heat from the electrical component to the housing.

15. The method in accordance with claim 13, the heat exchanger further comprising:

providing the at least one sidewall to include a first sidewall and a second sidewall;

providing the sidewall inner surface to include a first sidewall inner surface and a second sidewall inner surface, the first sidewall includes the first sidewall inner surface the second sidewall includes the second sidewall inner surface;

defining the plurality of fluid channels within the first sidewall inner surface of the first sidewall; and coupling the first sidewall to the second sidewall to form the heat exchange assembly such that each fluid channel of the plurality of fluid channels extends between the condenser section and the evaporator section.

16. The method in accordance with claim 15, wherein the coupling further comprises:

defining the at least one vapor channel within the second sidewall inner surface of the second sidewall; and coupling the first sidewall to the second sidewall such that the at least one vapor channel is coupled to the plurality of fluid channels to define a liquid-gas interface region from the condenser section to the evaporator section.

* * * * *